United States Patent
Hable et al.

(10) Patent No.: US 9,275,926 B2
(45) Date of Patent: Mar. 1, 2016

(54) POWER MODULE WITH COOLING STRUCTURE ON BONDING SUBSTRATE FOR COOLING AN ATTACHED SEMICONDUCTOR CHIP

(71) Applicant: Infineon Technologies AG, Neubiberg (DE)

(72) Inventors: Wolfram Hable, Neumarkt (DE); Andreas Grassmann, Regensburg (DE); Frank Winter, Regensburg (DE); Ottmar Geitner, Pentling (DE); Alexander Schwarz, Moehnesee (DE); Alexander Herbrandt, Warstein (DE); Lothar Koenig, Laaber (DE); Andre Uhlemann, Dortmund (DE)

(73) Assignee: Infineon Technologies AG, Neubiberg (DE)

(*) Notice: Subject to any disclaimer, the term of this patent is extended or adjusted under 35 U.S.C. 154(b) by 125 days.

(21) Appl. No.: 13/886,284

(22) Filed: May 3, 2013

(65) Prior Publication Data

US 2014/0327127 A1  Nov. 6, 2014

(51) Int. Cl.
| | |
|---|---|
| H01L 23/34 | (2006.01) |
| H01L 21/50 | (2006.01) |
| H01L 23/00 | (2006.01) |
| H01L 23/373 | (2006.01) |
| H01L 23/433 | (2006.01) |
| H01L 23/467 | (2006.01) |
| H01L 23/473 | (2006.01) |
| H01L 25/07 | (2006.01) |

(52) U.S. Cl.
CPC .............. *H01L 23/34* (2013.01); *H01L 21/50* (2013.01); *H01L 23/3735* (2013.01); *H01L 23/4334* (2013.01); *H01L 23/467* (2013.01); *H01L 23/473* (2013.01); *H01L 24/33* (2013.01); *H01L 24/36* (2013.01); *H01L 24/40* (2013.01); *H01L 25/072* (2013.01); *H01L 2224/40137* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01)

(58) Field of Classification Search
CPC ..... H01L 33/62; H01L 51/5012; H01L 51/56; H01L 51/0072; H01L 51/5056
USPC .......................... 257/712, 714, 722, E23.101
See application file for complete search history.

(56) References Cited

U.S. PATENT DOCUMENTS

| | | | |
|---|---|---|---|
| 2002/0118511 A1* | 8/2002 | Dujari et al. | 361/703 |
| 2006/0284308 A1 | 12/2006 | Harada | |
| 2009/0194862 A1 | 8/2009 | Kitami | |
| 2011/0069524 A1* | 3/2011 | Toba et al. | 365/63 |

(Continued)

FOREIGN PATENT DOCUMENTS

| | | |
|---|---|---|
| DE | 20 2009 000 615 U1 | 7/2010 |
| DE | 10 2010 003 533 A1 | 10/2011 |
| JP | 2006-310486 A | 11/2006 |

*Primary Examiner* — Andy Huynh

(57) ABSTRACT

According to an exemplary embodiment, a power module is provided which comprises a semiconductor chip, a bonding substrate comprising an electrically conductive sheet and an electric insulator sheet which is directly attached to the electrically conductive sheet and which is thermally coupled to the semiconductor chip, and an array of cooling structures directly attached to the electrically conductive sheet and configured for removing heat from the semiconductor chip when interacting with cooling fluid.

15 Claims, 8 Drawing Sheets

(56) References Cited

U.S. PATENT DOCUMENTS

| | | | |
|---|---|---|---|
| 2011/0316143 A1 | 12/2011 | Noritake | |
| 2012/0069524 A1* | 3/2012 | Schulz-Harder et al. | 361/716 |
| 2013/0020694 A1* | 1/2013 | Liang et al. | 257/691 |

* cited by examiner

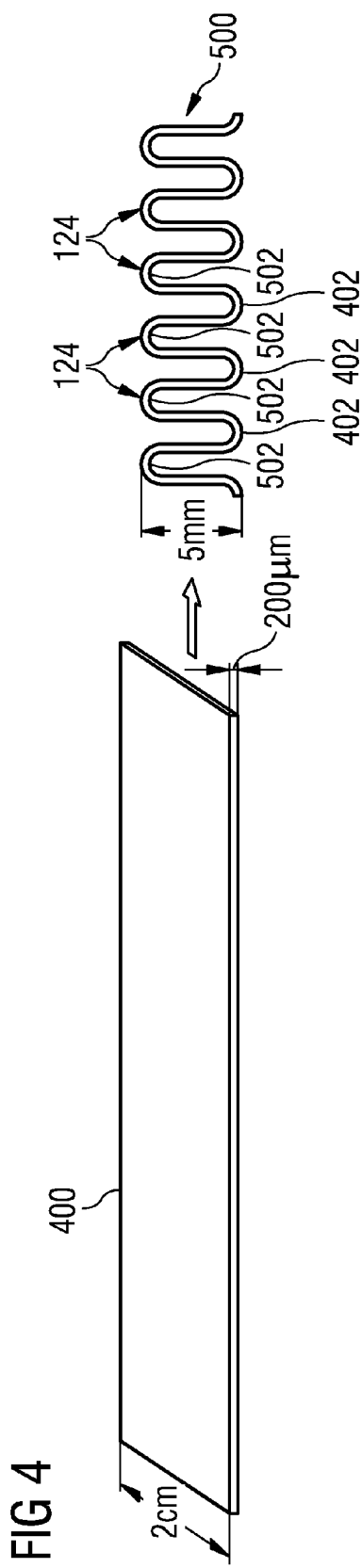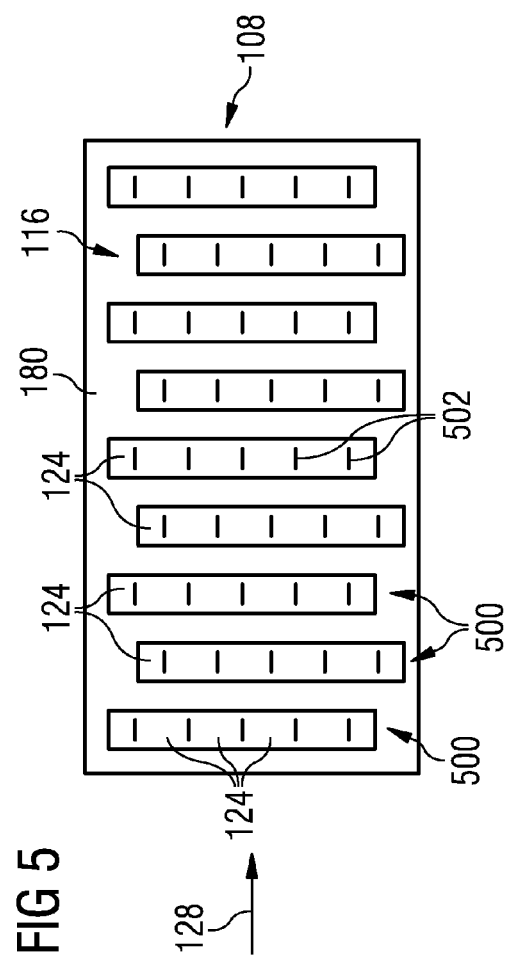

POWER MODULE WITH COOLING STRUCTURE ON BONDING SUBSTRATE FOR COOLING AN ATTACHED SEMICONDUCTOR CHIP

BACKGROUND OF THE INVENTION

1. Field of the Invention

The present invention relates to power modules and to methods of manufacturing a power module.

2. Description of the Related Art

A power module, for instance for automotive applications, provides a physical containment for power components, usually power semiconductor devices in form of electronic chips comprising one or more integrated circuit components. Examples of integrated circuit components of power modules are an insulated-gate bipolar transistor (IGBT), and a diode.

There is still potentially room to reduce manufacturing cost and to simplify connecting the electronic chips of power modules to an outer circuit while efficiently removing heat.

SUMMARY OF THE INVENTION

There may be a need for a power module allowing for an efficient removal of heat generated during operation while being simple in manufacture.

According to an exemplary embodiment, a power module is provided which comprises a semiconductor chip having a first main surface and a second main surface opposing the first main surface, a first bonding substrate having a first bonding surface coupled to the first main surface of the semiconductor chip and having a first heat removal surface opposing the first bonding surface, a second bonding substrate having a second bonding surface coupled to the second main surface of the semiconductor chip and having a second heat removal surface opposing the second bonding surface, a first cooling structure on the first heat removal surface configured for removing heat from the semiconductor chip when interacting with cooling fluid, and a second cooling structure on the second heat removal surface configured for removing heat from the semiconductor chip when interacting with cooling fluid.

According to another exemplary embodiment, a power module is provided which comprises a semiconductor chip having a first main surface and a second main surface opposing the first main surface, a two-dimensional first array of cooling loops thermally coupled to the first main surface and configured for removing heat from the semiconductor chip when interacting with cooling fluid, and a two-dimensional second array of cooling loops thermally coupled to the second main surface and configured for removing heat from the semiconductor chip when interacting with cooling fluid.

According to still another exemplary embodiment, a power module is provided which comprises a semiconductor chip, a bonding substrate comprising an electrically conductive sheet and an electric insulator sheet which is directly attached to the electrically conductive sheet and which is thermally coupled to the semiconductor chip, and an array of cooling structures directly attached to the electrically conductive sheet and configured for removing heat from the semiconductor chip when interacting with cooling fluid.

According to yet another exemplary embodiment, a method of manufacturing a power module is provided, wherein the method comprising coupling a first bonding surface of a first bonding substrate to a first main surface of a semiconductor chip, coupling a second bonding surface of a second bonding substrate to a second main surface of the semiconductor chip, wherein the second main surface opposes the first main surface, arranging a first cooling structure on a first heat removal surface of the first bonding substrate, wherein the first heat removal surface opposes the first bonding surface, arranging a second cooling structure on a second heat removal surface of the second bonding substrate, wherein the second heat removal surface opposes the second bonding surface, and configuring each of the first cooling structure and the second cooling structure for removing heat from the semiconductor chip when interacting with cooling fluid.

According to yet another exemplary embodiment, a method of manufacturing a power module is provided, wherein the method comprises thermally coupling a first two-dimensional array of cooling loops to a first main surface of a semiconductor chip, thermally coupling a second two-dimensional array of cooling loops to a second main surface of the semiconductor chip, wherein the second main surface opposes the first main surface, and configuring each of the first two-dimensional array of cooling loops and the second two-dimensional array of cooling loops for removing heat from the semiconductor chip when interacting with cooling fluid.

An exemplary embodiment may have the advantage that the removal of heat generated by the semiconductor chip during operation of the power module may be highly efficient as a consequence of the cooling structure design of the power module. This may be achieved by arranging cooling structures, being thermally coupled to the semiconductor chip, on two opposing external surfaces of the power module and/or by attaching such a cooling structure directly onto an exterior surface of a bonding substrate, being thermally coupled to the semiconductor chip. Consequently, cooling fluid flowing externally along the power module for interacting with the cooling structure for performing a heat exchange is enabled to efficiently remove heat generated by the semiconductor chip during operation of the power module.

DESCRIPTION OF FURTHER EXEMPLARY EMBODIMENTS

In the following, further exemplary embodiments of the power modules and the methods will be explained.

A gist of an exemplary embodiment can be seen in that one or more cooling structures such as one or more arrays of cooling loops can be provided on both opposing sides of the power module so that cooling fluid (such as a cooling gas and/or a cooling liquid) can be conducted along an outer surface of the power module so as to efficiently remove heat generated by the semiconductor chip during operation of the power module. This may be particularly performed with a direct surface cooling of bonding substrates on which two opposing main surfaces of the electronic chip is mounted.

In an embodiment, the first bonding substrate is configured as a first metal-electric insulator and thermal conductor-metal sheet stack (i.e. an electrically insulating and thermally conductive sheet sandwiched between two metal sheets or more generally, two electrically conductive and thermally conductive sheets) with its metallic first bonding surface coupled to the first main surface of the semiconductor chip and with its metallic first heat removal surface connected directly (i.e. without any intermediate components in between, hence with direct physical contact between metallic first heat removal surface and cooling structure) to the first cooling structure. By such a direct substrate bonding of the cooling structures without requiring a bulky baseplate, a very good heat transfer and a compact design can be achieved. The first metal-electric insulator and thermal conductor-metal sheet stack may thus be formed from an electrically insulating and thermally conductive layer (such as a ceramic) interposed between two opposing electrically and thermally conductive metal layers (such as made of aluminium or copper). The use of a metal for the two external electrically conductive sheets is preferred, particularly for the sheet which is directly connected to a metallic cooling structure, since this direct coupling works particularly well with a metal-metal connection. The other one of these metal layers or sheets may be used for directly or indirectly connecting the electronic chip. By taking this measure, the electronic chip may be attached to a thermally conductive layer stack which at the same time may accomplish data signal transmission and/or power supply between semiconductor chip and a connected device as well as efficient removal of heat produced by the semiconductor chip during its ordinary use.

In an embodiment, the second bonding substrate is configured as a second metal-electric insulator and thermal conductor-metal sheet stack with its metallic second bonding surface coupled to the second main surface of the semiconductor chip and with its metallic second heat removal surface connected directly to the second cooling structure. The second bonding substrate may be constructed as the first bonding substrate, see particularly the preceding paragraph. Hence, it is not only possible to couple a first main surface of the electronic chip to a metal-electric insulator and thermal conductor-metal sheet stack, but also the other opposing main surface. Therefore, a double-sided direct transfer of heat from both main surfaces of the electronic chip may be achieved, since the heat is sufficiently transferred from both main surfaces (i.e. the two usually parallel surfaces of a semiconductor chip having the largest surface areas of all of its surfaces) of the semiconductor chip via the respective sheet stack towards the connected cooling structure. While maintaining a compact construction of the power module, the heat dissipation is also rendered very efficiently by such an embodiment.

Any of these bonding substrates may be a three-sheet substrate with a central ceramic plate (for instance made of aluminium oxide or aluminium nitride or silicon nitride) as the electric insulator and thermal conductor sheet. As an alternative to a ceramic material, the electric insulator and thermal conductor sheet may also be made of a thermally conductive plastic material (which may comprise epoxide, silicone, etc.) and which may be optionally filled by a thermally conductive filler medium (such as aluminium oxide, boron nitride, silicon nitride, aluminium nitride, etc.). The metal sheets of any of the bonding substrates may be made of copper, aluminium, or copper covered with a surface layer of aluminium. Instead of metal sheets, it is possible to use any other electrically conductive and thermally conductive material.

In an embodiment, at least one of the first bonding substrate and the second bonding substrate comprises one of the group consisting of a Direct Copper Bonding (DCB) substrate, and a Direct Aluminium Bonding (DAB) substrate. Particularly, a DCB substrate may be used which comprises a ceramic (or other material) layer directly between a copper layer and another copper layer. A DCB substrate provides a proper basis for mounting of the semiconductor chip on one copper side and for efficient removal of heat via a cooling structure which may be mounted directly on the other copper side. Also by the use of a DAB substrate this goal may be achieved. DCB and DAB substrates are commercially available and therefore allow for a cost efficient solution of the mounting and cooling issues.

In an embodiment, at least one of the first cooling structure and the second cooling structure comprises an array of cooling loops. In the context of the present application, the term "array of cooling loops" may particularly denote an arrangement of a large number of loop-like, meander-like, saw toothlike or zigzag shaped thermally conductive structures. An array of cooling loops may comprise for instance at least 10, particularly at least 100, more particularly at least 500 individual loops, protruding vertically over the planar metal surface on which they are attached. Each loop may enclose—alone or together with the substrate surface on which the loop is attached—an annular opening through which cooling fluid may flow to achieve a highly intense heat exchange. They may be made of a metallic material such as aluminium or copper. Such loops may be directly bonded onto a metallic surface of the above-mentioned layer stack substrate to receive heat from the semiconductor chip which can then be transferred efficiently, thanks to the large active surface of the cooling loops, to a surrounding cooling fluid such as gas (for instance air) or liquid (for instance water). Such an array of cooling loops may be basically one-dimensional, i.e. a linear arrangement of the cooling loops. It is however further preferred that the cooling loops are arranged two-dimensionally so as to cover a for instance rectangular, planar surface area of both opposing surfaces of the power module. This provides for a very efficient transport of the heat away from the semiconductor chip.

In an embodiment, the array of cooling loops comprises at least one of the group consisting of bond wires and bond ribbons. These bond wires or ribbons may be meandrically bent. Bond wires may be considered as filament-like elements, preferably made of a metallic material (such as aluminium or copper or aluminium coated copper), which are directly connected to a metallic surface of an attachment substrate. In contrast to this, cooling ribbons may be strip- or sheet-like structures for instance made of a metallic material and being bent so as to form loops. Such cooling ribbons may have an even further increased surface so that the heat transport efficiency can be further increased. Both bond wire and bond ribbon may be attached onto a substrate surface by a standard bonder machine.

In an embodiment, at least one of the first cooling structure and the second cooling structure comprises one of the group of aluminium and aluminium alloy. Aluminium is a thermally highly conductive material which is also properly processible so as to form cooling loops. Copper is a good alternative as a material for the cooling structure.

In an embodiment, the power module comprises a thermal interconnect structure bridging the first bonding surface of the first bonding substrate and the first main surface of the semiconductor chip, wherein the second bonding substrate is directly connected to the second main surface of the semiconductor chip at the second bonding surface. In such an embodiment, one main surface of the semiconductor chip may be directly bonded onto a neighbored surface of one of the substrates. Therefore, a very good thermal coupling can be achieved there. On the other main surface of the semiconductor chip, a thermal interconnect structure (such as a solid metal block, for instance of copper) having a high thermal conductivity may be arranged in direct contact with the semiconductor chip on the one side and with the other substrate on the other side to thereby establish a proper thermal coupling and forming also a spacer there between semiconductor chip and substrate.

In an embodiment, the power module comprises a mould compound accommodating at least the semiconductor chip, the first bonding substrate, and the second bonding substrate. A lead frame may extend partially and the cooling structures may extend fully outside of the mould compound. Such a mould compound (or encapsulation structure) packages, houses or accommodates the above-mentioned components of the power module, particularly the two substrates and the semiconductor chips. It may house further components as well, such as an interconnect structure. The mould compound may be made of one or several materials and may for instance be made of a plastic material or a ceramic material.

In an embodiment, the mould compound connects continuously to the first bonding substrate and to the second bonding substrate so that an exterior surface of each of the first bonding substrate and the second bonding substrate is in flush with an exterior surface of the mould compound and that the first and second cooling structures protrude over the respective exterior surface. Hence, there may be a stepless transition between the exterior surface of a respective bonding surface and a connecting portion of the mould compound, thereby preventing undesired disturbance of the flow of cooling fluid along this exterior surface. Consequently, the heat exchange can be improved by such a continuous external surface.

In an embodiment, the power module may comprise a lead frame for electrically connecting the semiconductor chip to a receptacle (shaped and dimensioned for receiving the lead frame of the power module with a form closure to thereby establish a mechanical and electrical coupling at the same time) of a connectable device (such as a board into which the power module is to be inserted as an electronic component). The lead frame may extend partially within and partially out of the mould compound in parallel to the first heat removal surface and the second heat removal surface. With the lead frame, the power module comprises flat electric connecting contacts for an electric coupling to electrically conductive traces within the receptacle.

In an embodiment, the power module is configured as a plate-like power module. For instance, a dimension of the power module in a first direction and a second direction of the plate may be both at least 5 times, particularly at least 10 times, of a dimension of the power module in the third direction, the three directions being orthogonal to one another.

In an embodiment, the power module comprises a cooling casing enclosing at least the semiconductor chip, the first bonding substrate, the second bonding substrate, the first cooling structure, and the second cooling structure. It may also enclose the mould compound. The cooling casing may comprise a cooling fluid supply (such as a fluidic interface) for supplying the cooling fluid to the first cooling structure and the second cooling structure and a cooling fluid drain (such as another fluidic interface) for draining the cooling fluid after thermal exchange with the first cooling structure and the second cooling structure. The cooling casing may surround all other components of the power module, except optionally a part of the lead frame. Between the cooling casing and a mould compound or encapsulation structure of the power module, a void space may be formed through which the cooling fluid such as water (or a mixture of water and glycol, as available in many vehicles) can be pumped.

In an embodiment, at least one of the first two-dimensional array of cooling loops and the second two-dimensional array of cooling loops is configured as a set of parallel lines of cooling loops, wherein cooling loops of different lines are staggered relative to one another (for instance, alternating lines may be provided, wherein odd lines are aligned relative to one another, even lines are aligned relative to one another, and odd and even lines are misaligned relative to one another). Hence, in the flowing direction of the cooling fluid, the cooling fluid passes spatially misaligned cooling loops which involves a flow impedance. This promotes turbulence of the flowing cooling fluid which, in turn, improves the heat exchange between cooling fluid and the cooling loops.

In an embodiment, at least one of the first two-dimensional array of cooling loops and the second two-dimensional array of cooling loops is configured as a carpet of cooling loops. Particularly, the cooling loops may be arranged in rows and columns, thereby forming a basically matrix-like structure. Such a configuration is capable to efficiently remove heat from the power device.

In an embodiment, the semiconductor chip comprises at least one integrated circuit component of a group consisting of a switch, a diode, a half bridge, and an inverter. Integrated circuit components of the power module may hence be switches (such as a metal-oxide-semiconductor field effect transistor (MOSFET), an insulated-gate bipolar transistor (IGBT), etc.), half bridges (i.e. an inverter leg, with two switches and corresponding diodes), and three-phase inverters (i.e. six switches and corresponding diodes). Multiple of such components may be integrated in the same semiconductor chip, or multiple semiconductor chips comprising these and/or other integrated circuit components may form part of the power module. The power module may be configured for automotive applications, such as for a battery recharger in a hybrid vehicle. When charging such a battery or accumulator, a current of 400 Ampère or more can flow resulting in a huge heat dissipation. With the direct substrate cooling architecture, even more preferably with a double sided cooling, according to an exemplary embodiment such heat can be removed from the semiconductor chip in an efficient manner.

In an embodiment, the electric insulator sheet of the bonding substrate is made of a material which has a thermal conductivity of at least about 100 W/(m K), particularly of at least 200 W/(m K). Therefore, the electric insulator sheet may serve for electrically decoupling the semiconductor chip from an exterior of their power module while at the same time providing for a proper thermal coupling between the semiconductor chip and the exterior of the power module, i.e. the corresponding cooling structure.

According to an exemplary embodiment, a method of cooling a power module having the above-mentioned features is provided, wherein the method comprises guiding cooling fluid along the first cooling structure, and guiding cooling fluid along the second cooling structure. Such a cooling fluid may be a liquid such as water, or may be a gas such as air. The cooling fluid is supplied to the cooling structures so as to flow in a turbulent way rather than in a laminar way along and through the cooling structures. This ensures a pronounced heat exchange and therefore a proper cooling performance.

As a basis for forming the semiconductor chip, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology. For the packaging, moulding or encapsulation, a plastic material or a ceramic material may be used. Furthermore, exemplary embodiments may make use of standard semiconductor processing technologies such as appropriate etching technologies (including isotropic and anisotropic etching technologies, particularly plasma etching, dry etching, wet etching), patterning technologies (which may involve lithographic masks), deposition technologies (such as chemical vapor deposition (CVD), plasma enhanced chemical vapor deposition (PECVD), atomic layer deposition (ALD), sputtering, etc.).

The above and other objects, features and advantages of the present invention will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 4 illustrates the process of bending a bonding ribbon to form cooling loops for a power module according to an exemplary embodiment.

FIG. 5 illustrates a plan view of a Direct Copper Bonding substrate covered with lines of cooling loops produced according to FIG. 4.

DETAILED DESCRIPTION OF EXEMPLARY EMBODIMENTS

Figure 1:
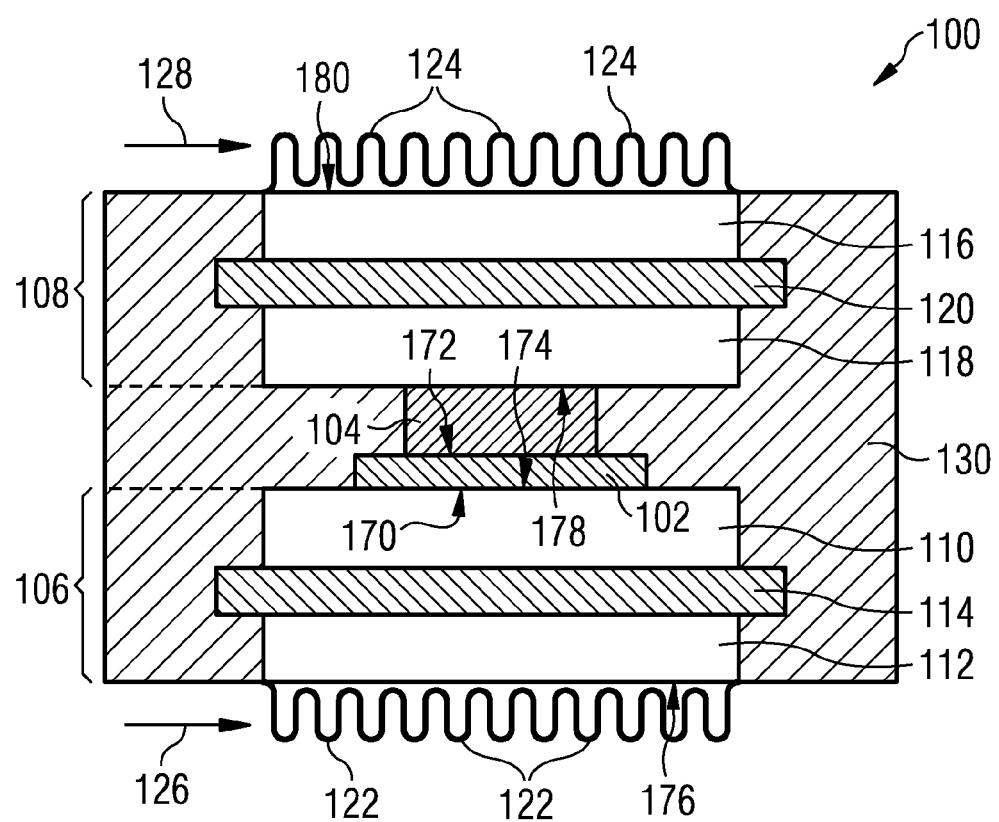
FIG. 1 shows a cross-sectional view of a power module according to an exemplary embodiment.

The illustration in the drawing is schematically.

Before describing further exemplary embodiments in further detail, some basic considerations of the present inventors will be summarized based on which exemplary embodiments have been developed which provide for a cost-efficient cooling of a power module.

Conventionally, different concepts have been considered to develop an efficiently coolable power module.

In one conventional concept, the power module is attached with heat conductive paste onto an external cooler. However, a shortcoming of such an approach is the poor heat coupling.

In another conventional approach, a power module is mounted on a water-cooled PinFin plate (for instance by soldering a DCB substrate on the PinFin plate). However, this has the shortcoming of high material costs for the PinFin plate and a heat coupling which is not sufficient for many applications in view of the interposed soldering layer and the thickness of the PinFin plate.

However, in both conventional concepts the removal or dissipation of heat only performs in one direction, for instance the bottom side of the module.

In contrast to such conventional approaches, an exemplary embodiment uses an outer or exterior (for instance copper) surface of a DCB substrate to bond on it wires or ribbons of a thermally conductive material (such as aluminium), so that a direct fluid cooling of the substrate may be realized. By a corresponding interior constitution of the power module, two opposing large surface areas can be used for this purpose. Hence, a double-sided cooling of the power module can be established.

It is also possible to use a DAB (Direct Aluminium Bonding) substrate or other similar substrates so that the cooling interface can for instance be of pure aluminium (substrate sheet plus bond structures). The cooling wire/ribbon as well as the metallization of the substrate may be of pure aluminium or an aluminium alloy so that corrosion effects can be suppressed. A nickel coating, as may be used in case of DCB substrates, may be dispensable which further reduces the costs.

Concluding, a gist of an exemplary embodiment is the double-sided application of cooling wires or cooling ribbons or other kinds of cooling structures directly on surfaces of the substrate.

In the following, referring to FIG. 1, a cross-sectional view of a power module 100 according to an exemplary embodiment will be explained.

The power module 100 comprises a semiconductor chip 102. The semiconductor chip 102 comprises a semiconductor substrate, for instance made of silicon, and comprises a plurality of integrated circuit components (not shown), such as transistors, diodes, or the like, being integrated in the semiconductor substrate. The semiconductor chip 102 has been singularized from a wafer. As can further be taken from FIG. 1, the semiconductor chip 102 comprises a bottom main surface 170 and an upper main surface 172. Hence, the two main surfaces 170, 172 are arranged on opposing sides of the semiconductor chip 102 and are the two largest ones of all surface areas of the semiconductor chip 102. Instead of a single semiconductor chip 102, it is also possible that a plurality of semiconductor chips 102 are assembled in the power module 100.

A first Direct Copper Bonding (DCB) substrate 106 forms also part of the power module 100 and serves as a first bonding substrate for the semiconductor chips 102. The first DCB substrate 106 has an upper bonding surface 174 which is directly connected to the bottom main surface 170 of the semiconductor chip 102. Opposing the upper bonding surface 174 is a lower heat removal surface 176 of the first DCB substrate 106.

Additionally, a second Direct Copper Bonding (DCB) substrate 108 is provided which has a lower bonding surface 178 which is coupled, indirectly via a thermal interconnect 104 embodied as a copper block and functioning as a thermally conductive spacer, to the upper bonding surface 172 of the semiconductor chip 102. The second DCB substrate 108 furthermore has an upper heat removal surface 180 which opposes the lower bonding surface 178. Both the lower heat removal surface 176 as well as the upper heat removal surface 180 are partly exposed to the surrounding atmosphere, i.e. partly form outer surface portions of the power module 100 exposed to an environment.

A first two-dimensional array of power loops 122 having a meandered appearance in FIG. 1 is arranged like a carpet in a two-dimensional manner (i.e. extending in the horizontal direction of FIG. 1 and in a direction perpendicular to the paper plane of FIG. 1) directly on the lower heat removal surface 176. In a corresponding way, a second two-dimensional array of power loops 124 having a meandrical appearance in FIG. 1 is arranged like a carpet in a two-dimensional manner (i.e. extending in the horizontal direction of FIG. 1 and in the direction perpendicular to the paper plane of FIG. 1) directly on the upper heat removal surface 180. The cooling loops 122, 124 are made of aluminium alloy so as to enable a proper heat transfer in view of the very good thermal conductivity of aluminium as well as to provide a corrosion protection by added metal of the aluminium alloy.

The first DCB substrate 106 is made of a central ceramic plate 114 which, on both of its opposing main surfaces, comprises a respective copper layer 110, 112. In a similar way, also the second DCB substrate 108 comprises a central ceramic layer 120 having attached to its main surfaces a respective copper layer 116, 118.

A package or mould compound 130 made of a plastic material is used as an encapsulation of the various components of the power module 100. Hence, the semiconductor chip 102 with the connected DCB substrates 106, 108 is packaged by moulding compound 130, as can be taken from FIG. 1.

When the semiconductor chip 102 is in normal use, its processing performance generates ohmic heat. This is removed efficiently via both of its main surfaces 170, 172. By its lower main surface 170, heat transfer is accomplished via the first DCB substrate 106 and the cooling loops 122. But also via its upper surface 172, efficient heat removal is enabled via the thermal interconnect 104, the second DCB substrate 108 and the cooling loops 124. The heat energy transferred to the cooling loops 122, 124 can be transported away from the power module 100 by cooling fluid 126, 128, respectively, which can be conducted along the upper surface and the lower surface of the power module 100.

As can be taken from FIG. 1, the upper heat removal surface 180 of the second DCB substrate 108 and the upper surface of the mould compound 130 form a continuous step-free structure with aligning surface portions which are in flush with one another. The same holds for the lower heat removal surface 176 of the first DCB substrate 106 and the connected surface portion of the mould compound 130. Only the cooling loops 124, 122 protrude vertically over these continuous planar surfaces on both the upper and the lower sides of the power module 100. Consequently, the cooling fluid 126, 128 flowing in a direction indicated by arrows in FIG. 1 in a laminar way will then flow in a turbulent way around cooling loops 124, 122 protruding over the planar surface of the power module 100 so as to perform a very efficient heat exchange.

Figure 2:
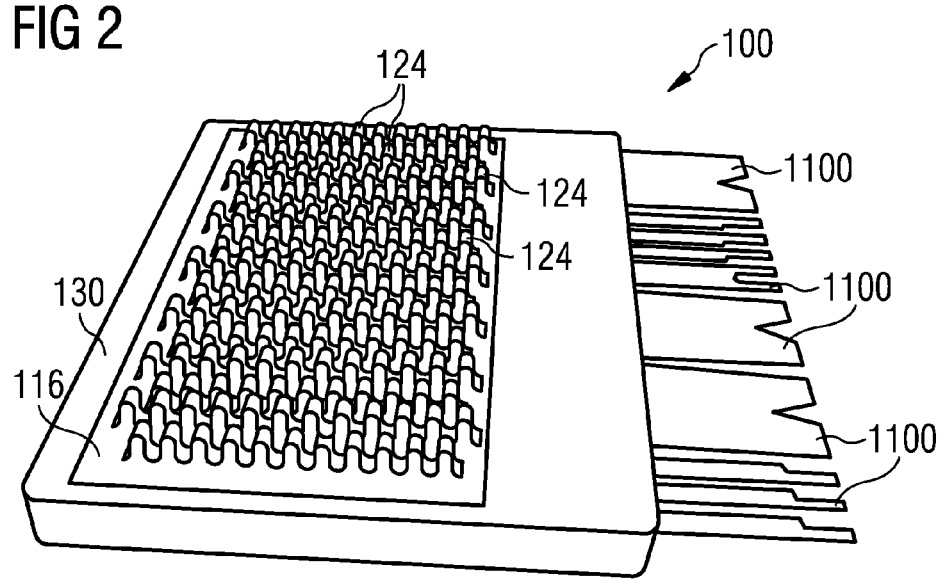
FIG. 2 shows a first three dimensional view of a power module according to another exemplary embodiment.
Figure 3:
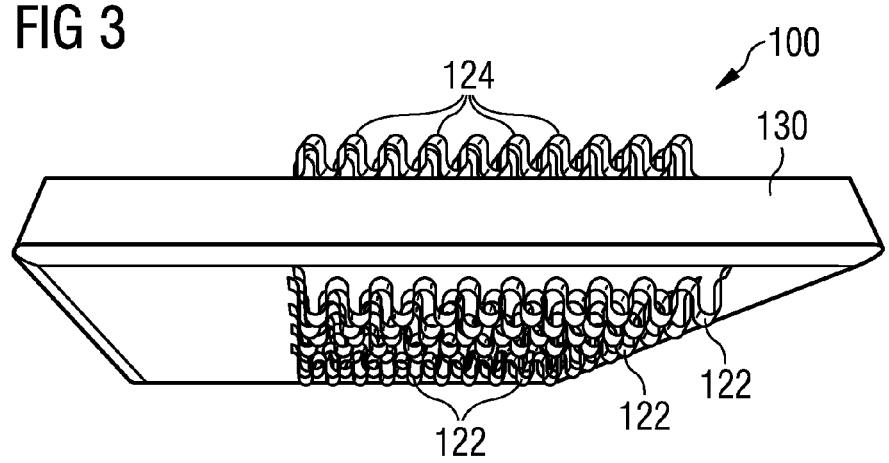
FIG. 3 shows a second three dimensional view of the power module of FIG. 2.

FIG. 2 shows a first three-dimensional view of a power module 100 of the type shown in FIG. 1 according to an exemplary embodiment. FIG. 3 shows another three-dimensional view of this cartridge-like power module 100.

As can be taken from FIG. 2 and FIG. 3, rigid planar contact strips of a lead frame 1100 which is electrically coupled to a semiconductor chip encapsulated by mould compound 130 protrude out of the mould compound 130 and form an electric coupling structure for connection to a board, rack or other kind of device.

FIG. 4 illustrates a process of bending a bonding ribbon 400 to form cooling loops 124 for a power module (such as the one shown in FIG. 1 to FIG. 3) according to an exemplary embodiment. The shown bonding ribbon 400 is of the type which is used by a bonder machine for forming ribbon bonds. It has a width of 2 cm, more generally in a range between 3 mm and 5 cm. Its thickness is in this embodiment 200 µm. More generally, it may have a thickness in a range between 100 µm and 400 µm. When treating the bonding ribbon 400 with a bonder machine, it may be bent to thereby form the meandrical cooling loop 124 shown in FIG. 4. Upper tips thereof are denoted with reference numeral 502. Connections portions to a bonding substrate are denoted with reference numeral 402. The cooling loops 124 have a height of 5 mm. More generally, they may have a height in a range between 1 mm and 1 cm.

FIG. 5 illustrates a plan view of a Direct Copper Bonding (DCB) substrate 108 covered with lines 500 of cooling loops 124 produced according to FIG. 4 (which shows one such line). FIG. 5 illustrates that the individual lines 500 are misaligned alternatingly, so that also the tips 502 of the cooling loops 124 of adjacent lines 500 are misaligned. This promotes a turbulent flow of cooling liquid 128 when passing the cooling loops 124, thereby further improving the heat exchange.

Figure 6:
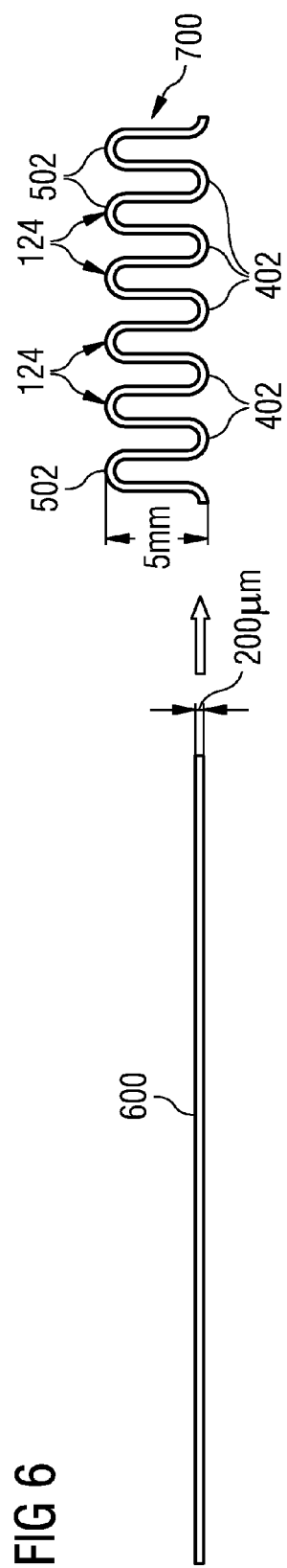
FIG. 6 illustrates the process of bending a bonding wire to form cooling loops for a power module according to an exemplary embodiment.

FIG. 6 illustrates the process of bending a bonding wire 600 to form a cooling loop 124 for a power module (such as the one shown in FIG. 1 to FIG. 3) according to an exemplary embodiment. The shown bonding wire 600 is of the type which is used by a bonder machine for forming wire bonds. It has a circular cross-section with a diameter of 200 µm. More generally, it may have a diameter in a range between 100 µm and 1 mm. When treating the bonding wire 600 with a bonder machine, it may be bent to thereby form the meandrical cooling loop 124 shown in FIG. 6. Upper tips thereof are denoted with reference numeral 502. Connections portions to a bonding substrate are denoted with reference numeral 402. The cooling loops 124 have a height of 5 mm. More generally, they may have a height in a range between 1 mm and 1 cm.

Figure 7:
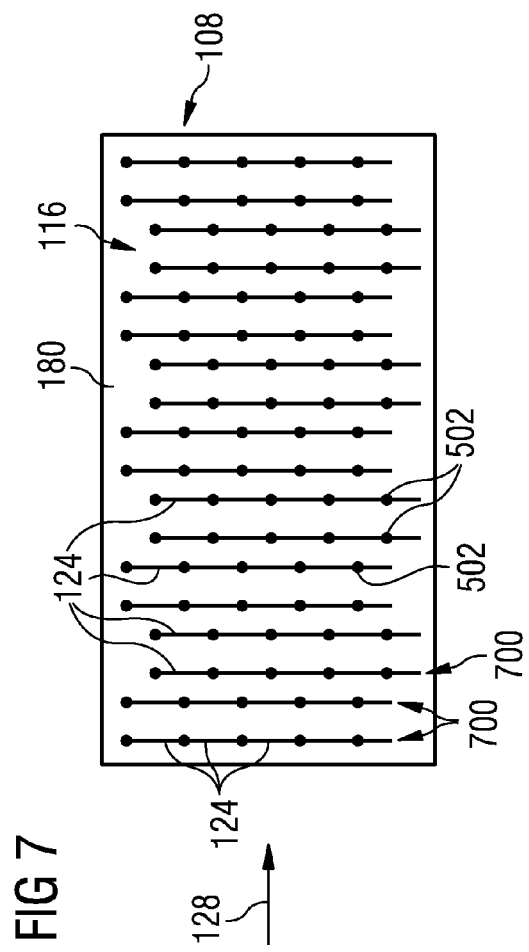
FIG. 7 illustrates a plan view of a Direct Copper Bonding substrate covered with lines of cooling loops produced according to FIG. 6.

FIG. 7 illustrates a plan view of a DCB substrate 108 covered with lines 700 of cooling loops 124 produced according to FIG. 6 (which shows one such line). FIG. 7 illustrates that the individual lines 700 are grouped into alternating pairs of adjacent lines 700. Adjacent line pairs are misaligned relative to one another, so that also tips 502 of the cooling loops 124 of different pairs of lines 700 are misaligned. This promotes a turbulent flow of cooling liquid 128 when passing the cooling loops 124, thereby further improving the heat exchange.

FIG. 8 to FIG. 15 illustrate different structures obtained during carrying out a process of manufacturing a power module 100 with double sided direct substrate cooling according to an exemplary embodiment.

Figure 8:
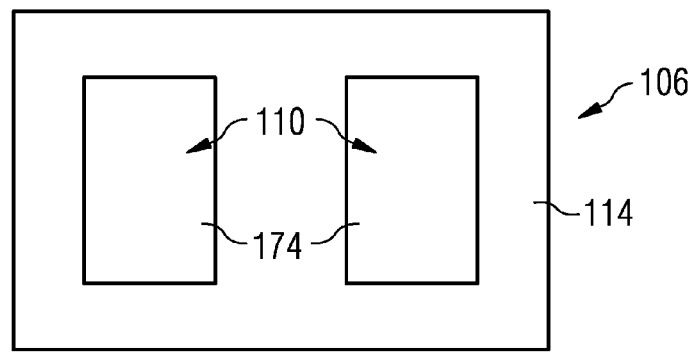
FIG. 8 to FIG. 15 illustrate different structures obtained during carrying out a process of manufacturing a power module with double sided direct substrate cooling according to an exemplary embodiment.

FIG. 8 shows a plan view of a first Direct Copper Bonding substrate 106 with a ceramic plate 114 on which a copper plate 110 has been patterned to form two distinct portions.

Figure 9:
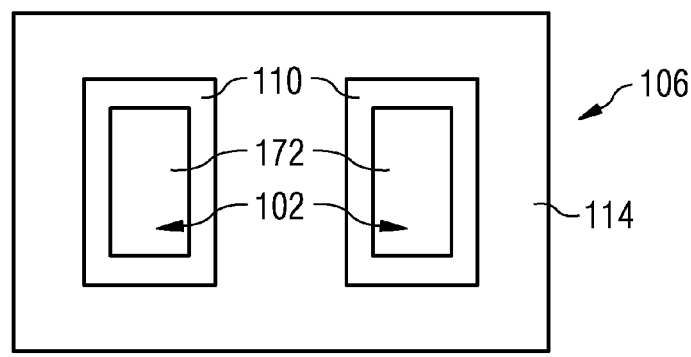

As shown in FIG. 9, two semiconductor chips 102 are then placed on top of the layer sequence of FIG. 8, more precisely one semiconductor chip 102 is mounted on each distinct portion of the patterned copper plate 110. In other embodiments, any other number of semiconductor chips 102 may be mounted on the first Direct Copper Bonding substrate 106, for instance between one and twelve. When using the power module 100 to be manufactured for automotive applications (for instance for a recharger of a hybrid vehicle), it may be appropriate to integrate at least one IGBT and at least one diode in semiconductor chip(s) 102.

Figure 10:
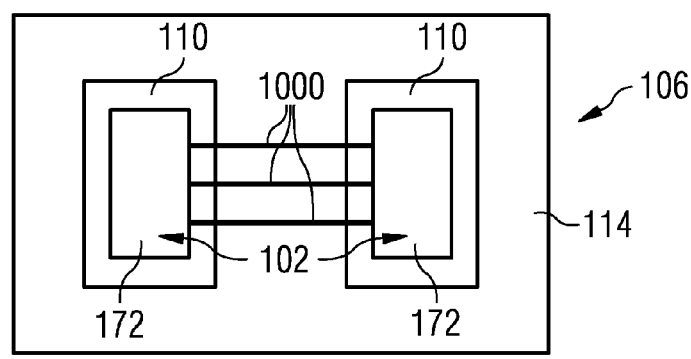

As can be taken from a further plan view shown in FIG. 10, electrically conductive leads 1000 may then be formed on top of the layer sequence of FIG. 9 so as to form electrical connections between the semiconductor chips 102.

Figure 11:
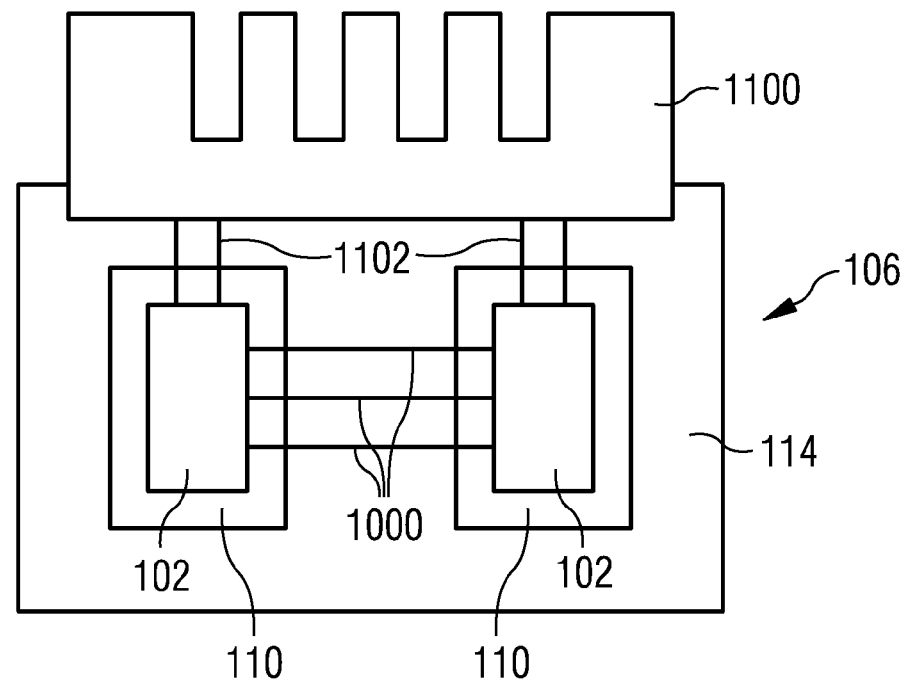

FIG. 11 shows another plan view of a structure in which, based on FIG. 10, a lead frame 1100 has been connected physically to the ceramic plate 114 and, via electrically conductive leads 1102, electrically to the semiconductor chips 102. The connection of the lead frame 1100 to the structure of FIG. 10 can be performed by soldering, welding, or the like.

Figure 12:
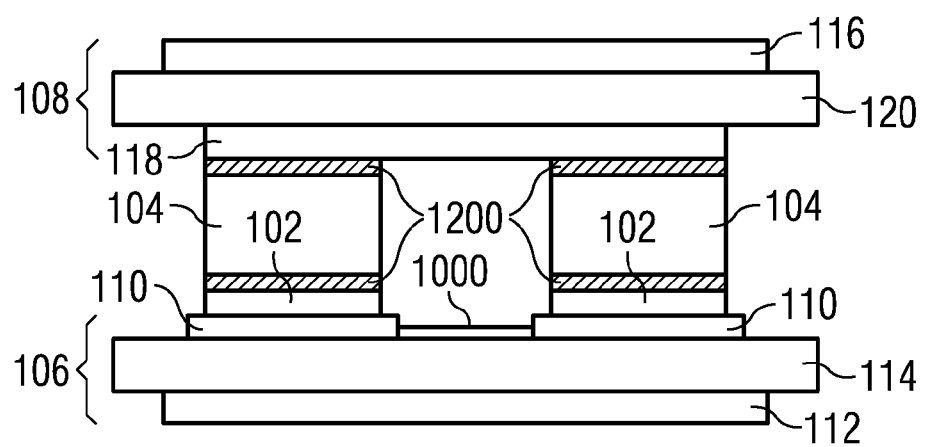

FIG. 12 shows a cross sectional view of a structure which comprises the structure of FIG. 11. According to FIG. 12, the structure of FIG. 11 has been connected to a second Direct Copper Bonding substrate 108 via optional thermal interconnects 104 in form of copper bodies which also serve as spacers. The connection of the lower and the upper surfaces of the thermal interconnects 104 is performed simultaneously by the use of solder paste 1200.

Figure 13:
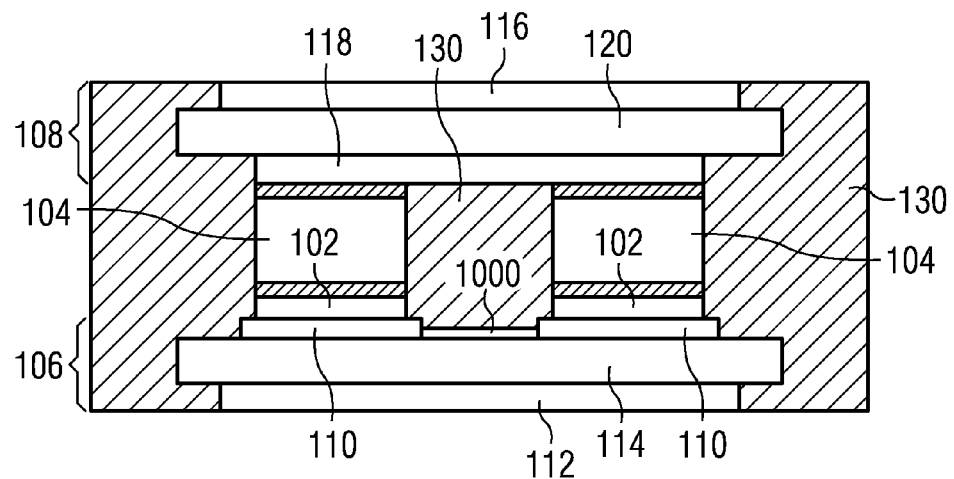

In order to obtain the structure shown in a cross sectional view in FIG. 13, the structure of FIG. 12 is encapsulated by a moulding compound 130 of thermally conductive plastic material.

Figure 14:
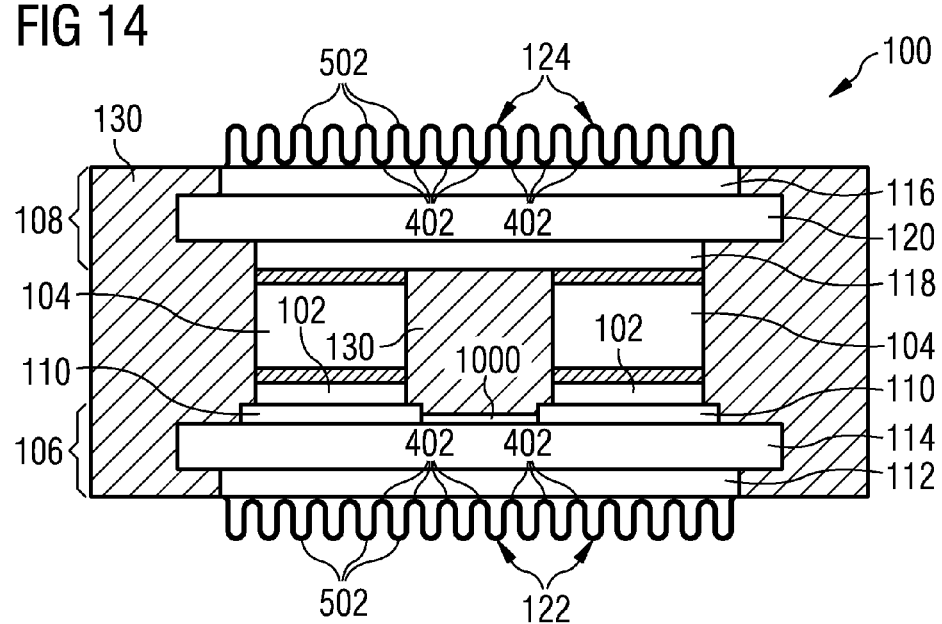

In order to obtain the power module 100 according to an exemplary embodiment shown in FIG. 14 based on the structure shown in FIG. 13, cooling loops 122, 124 are formed directly on the exterior exposed metal surfaces of the copper plates 116, 112, respectively. For this purpose, a conventional wire bonder (not shown) may cut, bend and attach (for instance by ultrasound) sections of bond wire from an endless roll directly onto the metallic surfaces of the copper plates 116, 112 while pulling on portions of the bond wire to thereby form tips 502.

Figure 15:
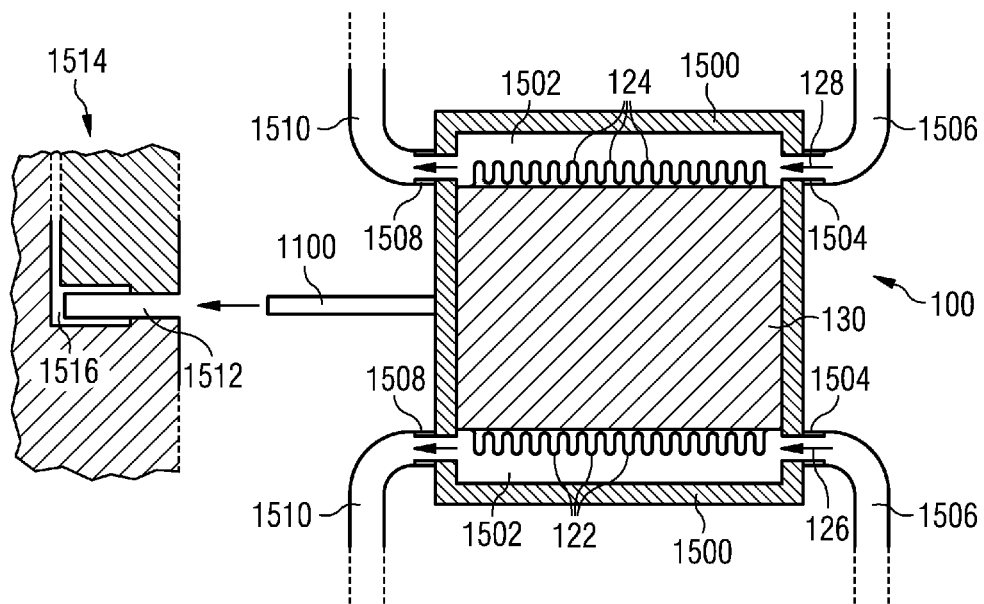

FIG. 15 shows that a hollow cooling casing 1500 has been mounted over the semiconductor chips 102, the bonding substrates 106, 108 the cooling loops 122, 124 and the moulding structure 130. It particularly encloses the latter components in a way to maintain a void space 1502 in between. Only the lead frame 1100 extends out of the cooling casing 1500. As can be taken from FIG. 15, the cooling casing 1500 has cooling liquid supplies 1504 connectable to supply hoses 1506 so that cooling water 126, 128 can be supplied to the void space 1500 to promote turbulent heat exchange with the cooling loops 122, 124. After this heat exchange, the cooling water 126, 128 is removed from the void space 1502 via cooling liquid drains 1508 and connected drain hoses 1510.

The power module 100 (with cooling casing 1500) can then be inserted into a receptacle 1512 of a board 1514 so that a mechanical and an electrical connection is formed. Particularly, the lead frame 1100 is then in electric contact with electrically conductive traces 1516 of the board 1514. The removal of the heat, generated by the semiconductor chips 102, by the turbulent heat exchange between the cooling liquid and the double sided cooling loops 122, 124 which are directly bound to the DCB substrates 106, 108 provides for a very efficient cooling.

Figure 16:
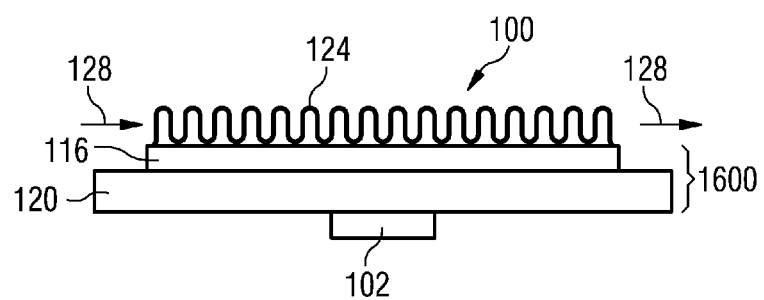
FIG. 16 shows a power module according to another exemplary embodiment.

FIG. 16 shows a power module 100 according to another exemplary embodiment.

The power module 100 of FIG. 16 is a very simple embodiment. It comprises a semiconductor chip 102, a bonding substrate 1600 comprising an electrically conductive sheet 116 and a thermally conductive electric insulator sheet 120 which is directly attached to the electrically conductive sheet 116 and which is thermally coupled to the semiconductor chip 102. An array of cooling loops 124 is directly attached to the electrically conductive sheet 116 and is configured for removing heat from the semiconductor chip 102 when interacting with cooling fluid 128.

Already this simple embodiment provides the advantage of direct substrate cooling, i.e. a direct attachment of the cooling loops 124 onto electrically conductive sheet 116. Hence, without the requirement of a bulky base plate, the semiconductor chip 102 can be cooled efficiently. Optionally, and not shown in FIG. 16, a further metal sheet can be provided between the semiconductor chip 102 and the electric insulator sheet 120 so that the two metal sheets and the electric insulator sheet 120 then can form together a Direct Copper Bonding substrate.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A power module, comprising:
   a semiconductor chip having a first main surface and a second main surface opposing the first main surface;
   a first bonding substrate having a first bonding surface coupled to the first main surface of the semiconductor chip and having a first heat removal surface opposing the first bonding surface;
   a second bonding substrate having a second bonding surface coupled to the second main surface of the semiconductor chip and having a second heat removal surface opposing the second bonding surface;
   a first cooling structure on the first heat removal surface configured for removing heat from the semiconductor chip when interacting with cooling fluid; and
   a second cooling structure on the second heat removal surface configured for removing heat from the semiconductor chip when interacting with cooling fluid;
   wherein at least one of the first cooling structure and the second cooling structure comprises an array of cooling loops;
   wherein the array of cooling loops comprises at least one of the group consisting of meandrically bent bond wires and meandrically bent bond ribbons.

2. The power module according to claim 1, wherein the first bonding substrate is configured as a first metal-electric insulator and thermal conductor-metal sheet stack with its metallic first bonding surface coupled to the first main surface of the semiconductor chip and with its metallic first heat removal surface connected directly to the first cooling structure.

3. The power module according to claim 2, wherein the second bonding substrate is configured as a second metal-electric insulator and thermal conductor-metal sheet stack with its metallic second bonding surface coupled to the second main surface of the semiconductor chip and with its metallic second heat removal surface connected directly to the second cooling structure.

4. The power module according to claim 1, wherein at least one of the first bonding substrate and the second bonding substrate comprises one of the group consisting of a Direct Copper Bonding substrate, and a Direct Aluminium Bonding substrate.

5. The power module according to claim 1,
   comprising a thermal interconnect structure bridging the first bonding surface of the first bonding substrate and the first main surface of the semiconductor chip;
   wherein the second bonding substrate is directly connected to the second main surface of the semiconductor chip at the second bonding surface.

6. The power module according to claim 1, comprising a mould compound encapsulating the semiconductor chip, the first bonding substrate, and the second bonding substrate.

7. The power module according to claim 6, wherein the mould compound connects continuously to the first bonding substrate and to the second bonding substrate so that an exterior surface of each of the first bonding substrate and the second bonding substrate is in flush with an exterior surface of the mould compound and that the first and second cooling structures protrude over the respective exterior surface.

8. The power module according to claim 6, comprising a lead frame for electrically connecting the semiconductor chip to a receptacle of a connectable device, wherein the lead frame extends partially out of the mould compound in parallel to the first heat removal surface and the second heat removal surface.

9. The power module according to claim 1, comprising a cooling casing enclosing the semiconductor chip, the first bonding substrate, the second bonding substrate, the first cooling structure, and the second cooling structure and comprising a cooling fluid supply for supplying the cooling fluid to the first cooling structure and the second cooling structure and a cooling fluid drain for draining the cooling fluid after thermal exchange with the first cooling structure and the second cooling structure.

10. A power module, comprising:
- a semiconductor chip having a first main surface and a second main surface opposing the first main surface;
- a two-dimensional first array of cooling loops thermally coupled to the first main surface and configured for removing heat from the semiconductor chip when interacting with cooling fluid; and
- a two-dimensional second array of cooling loops thermally coupled to the second main surface and configured for removing heat from the semiconductor chip when interacting with cooling fluid;
- wherein the array of cooling loops comprises at least one of the group consisting of meandrically bent bond wires and meandrically bent bond ribbons.

11. The power module according to claim 10, further comprising:
- a first metal-electric insulator and thermal conductor-metal sheet stack having a metallic first bonding surface coupled to the first main surface of the semiconductor chip and having a metallic first heat removal surface opposing the first bonding surface and connected to the first array of cooling loops;
- a second metal-electric insulator and thermal conductor-metal sheet stack having a metallic second bonding surface coupled to the second main surface of the semiconductor chip and having a metallic second heat removal surface opposing the second bonding surface and connected to the second array of cooling loops.

12. The power module according to claim 10, wherein at least one of the first two-dimensional array of cooling loops and the second two-dimensional array of cooling loops is configured as a set of parallel lines of cooling loops, wherein cooling loops of different lines are staggered relative to one another.

13. A power module, comprising:
- a semiconductor chip;
- a bonding substrate comprising an electrically conductive sheet and an electric insulator sheet which is directly attached to the electrically conductive sheet and which is thermally coupled to the semiconductor chip; and
- an array of cooling structures directly attached to the electrically conductive sheet and configured for removing heat from the semiconductor chip when interacting with cooling fluid;
- wherein the array of cooling structures comprises an array of cooling loops; and
- wherein the array of cooling loops comprises at least one of the group consisting of meandrically bent bond wires and meandrically bent bond ribbons.

14. The power module according to claim 13, wherein the semiconductor chip comprises at least one integrated circuit component of a group consisting of a switch, a diode, a half bridge, and an inverter.

15. The power module according to claim 13, wherein the electric insulator sheet is made of a material which has a thermal conductivity of at least 100 W/(m K).

* * * * *